(12) United States Patent
Sugisawa et al.

(10) Patent No.: US 9,159,948 B2
(45) Date of Patent: Oct. 13, 2015

(54) DISPLAY DEVICE INCLUDING LIGHT-EMITTING ELEMENT AND ELECTRONIC DEVICE

(71) Applicants: Nozomu Sugisawa, Atsugi (JP); Hisao Ikeda, Zama (JP); Katsuhiro Kikuchi, Osaka (JP); Manabu Niboshi, Osaka (JP); Satoshi Inoue, Osaka (JP); Yuto Tsukamoto, Osaka (JP); Shinichi Kawato, Osaka (JP)

(72) Inventors: Nozomu Sugisawa, Atsugi (JP); Hisao Ikeda, Zama (JP); Katsuhiro Kikuchi, Osaka (JP); Manabu Niboshi, Osaka (JP); Satoshi Inoue, Osaka (JP); Yuto Tsukamoto, Osaka (JP); Shinichi Kawato, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/215,684

(22) Filed: Mar. 17, 2014

(65) Prior Publication Data

US 2014/0284575 A1 Sep. 25, 2014

(51) Int. Cl.
*H01L 35/24* (2006.01)
*H01L 51/52* (2006.01)
*H01L 27/32* (2006.01)

(52) U.S. Cl.
CPC ........ *H01L 51/5218* (2013.01); *H01L 27/3246* (2013.01); *H01L 51/5209* (2013.01); *H01L 51/5215* (2013.01); *H01L 51/5265* (2013.01)

(58) Field of Classification Search
CPC ............ H01L 51/5209; H01L 51/5215; H01L 51/5218; H01L 27/3246

USPC .................................. 257/40, 88, 89, 93, 98
See application file for complete search history.

(56) References Cited

U.S. PATENT DOCUMENTS

| | | |
|---|---|---|
| 5,144,288 A | 9/1992 | Hamada et al. |
| 5,780,174 A | 7/1998 | Tokito et al. |
| 5,869,929 A | 2/1999 | Eida et al. |
| 5,891,554 A | 4/1999 | Hosokawa et al. |
| 6,023,073 A | 2/2000 | Strite |
| 6,049,167 A | 4/2000 | Onitsuka et al. |
| 6,091,078 A | 7/2000 | Codama |
| 6,111,355 A | 8/2000 | Inoue |
| 6,124,024 A | 9/2000 | Hosokawa et al. |
| 6,140,764 A | 10/2000 | Xu et al. |
| 6,147,451 A | 11/2000 | Shibata |
| 6,160,273 A | 12/2000 | Fork |
| 6,163,110 A | 12/2000 | Arai |
| 6,366,017 B1 | 4/2002 | Antoniadis |
| 6,366,025 B1 | 4/2002 | Yamada |

(Continued)

FOREIGN PATENT DOCUMENTS

JP 2007-012370 A 1/2007

*Primary Examiner* — Matthew E Warren
(74) *Attorney, Agent, or Firm* — Eric J. Robinson; Robinson Intellectual Property Law Office, P.C.

(57) ABSTRACT

To inhibit surface reflection of a display device. A display device which includes a reflective electrode layer 110; a partition 118 formed to surround the reflective electrode layer; a layer 120 containing a light-emitting organic compound and formed over the partition and the reflective electrode layer; a semi-transmissive electrode layer 122 formed over the layer containing the light-emitting organic compound; and a coloring layer 162 formed over the semi-transmissive electrode layer. The coloring layer overlaps with the reflective electrode layer and the partition. The partition does not overlap with the reflective electrode layer.

20 Claims, 12 Drawing Sheets

(56) References Cited

U.S. PATENT DOCUMENTS

| | | |
|---|---|---|
| 6,505,901 B1 | 1/2003 | Fukuda |
| 6,639,250 B1 | 10/2003 | Shimoda et al. |
| 6,680,570 B2 | 1/2004 | Roitman et al. |
| 6,833,668 B1 | 12/2004 | Yamada |
| 6,847,163 B1 | 1/2005 | Tsutsui et al. |
| 6,906,457 B2 | 6/2005 | Song et al. |
| 7,317,282 B2 | 1/2008 | Tsutsui et al. |
| 8,110,983 B2 | 2/2012 | Tsutsui et al. |
| 2004/0061121 A1* | 4/2004 | Uchida .......................... 257/82 |
| 2005/0037234 A1 | 2/2005 | Kim et al. |
| 2005/0084712 A1 | 4/2005 | Kido et al. |
| 2005/0098207 A1 | 5/2005 | Matsumoto et al. |
| 2005/0106419 A1 | 5/2005 | Endoh et al. |
| 2006/0008740 A1 | 1/2006 | Kido et al. |
| 2007/0001570 A1 | 1/2007 | Nomura et al. |
| 2010/0181559 A1* | 7/2010 | Nakatani et al. ............... 257/40 |
| 2012/0161160 A1 | 6/2012 | Tsutsui et al. |
| 2012/0228590 A1* | 9/2012 | Matsumi ........................ 257/40 |
| 2014/0284642 A1* | 9/2014 | Yamazaki et al. .............. 257/98 |

* cited by examiner

113

114   114

132

115

Conventional Art

Conventional Art

DISPLAY DEVICE INCLUDING LIGHT-EMITTING ELEMENT AND ELECTRONIC DEVICE

BACKGROUND OF THE INVENTION

1. Field of the Invention

The present invention relates to display devices and electronic devices.

2. Description of the Related Art

FIG. 11 illustrates a conventional EL panel with a structure (WTC structure) including what is called a microcavity (micro optical resonator) and a color filter.

The EL panel illustrated in FIG. 11 includes a first substrate 2102; a reflective electrode layer 2110 formed as an anode over the first substrate 2102; a first transparent electrode layer 2112 formed as an anode over the reflective electrode layer 2110 in a B pixel region 2172; a second transparent electrode layer 2114 formed over the reflective electrode layer 2110 in a G pixel region 2174; a third transparent electrode layer 2116 formed over the reflective electrode layer 2110 in an R pixel region 2176; a partition layer 2118 formed over the first transparent electrode layer 2112, the second transparent electrode layer 2114, and the third transparent electrode layer 2116; an EL layer 2120 formed over the partition layer 2118, the first transparent electrode layer 2112, the second transparent electrode layer 2114, and the third transparent electrode layer 2116; a semi-transmissive electrode layer 2122 formed as a cathode over the EL layer 2120; and a second substrate 2152 facing the first substrate 2102 (for example, see Patent Document 1).

On the second substrate 2152, a color filter (blue) (denoted as CF(B) in FIG. 11), a color filter (green) (denoted as CF(G) in FIG. 11), and a color filter (red) (denoted as CF(R) in FIG. 11) are formed, as well as a black matrix BM provided between the CF(B), CF(G), and CF(R).

Note that in FIG. 11, a portion where the black matrix BM is formed is denoted as an area 2201; the central portion (light-emitting region) of the B pixel region 2172 where the partition layer 2118 is not formed is denoted as an area 2202; the central portion (light-emitting region) of the G pixel region 2174 where the partition layer 2118 is not formed is denoted as an area 2204; the central portion (light-emitting region) of the R pixel region 2176 where the partition layer 2118 is not formed is denoted as an area 2206; an end portion (non-light-emitting region) of the B pixel region 2172 where the partition layer 2118 is formed is denoted as an area 2203; an end portion (non-light-emitting region) of the G pixel region 2174 where the partition layer 2118 is formed is denoted as an area 2205; and an end portion (non-light-emitting region) of the R pixel region 2176 where the partition layer 2118 is formed is denoted as an area 2207.

In the EL panel illustrated in FIG. 11, the display quality of the panel suffers due to reflection of external light in the areas 2201 to 2207 (for example, contrast or NTSC ratio is reduced).

FIG. 12 shows measurement results of reflectances in the areas 2201 to 2207 when external light enters the EL panel illustrated in FIG. 11. The results show the following relationship: the reflectances in the non-light-emitting areas (areas 2203, 2205, and 2207)>the reflectances in the light-emitting areas (areas 2202, 2204, and 2206)>the reflectance in the BM (area 2201). In the areas 2203, 2205, and 2207, the reflectance in the area including the color filter (green) (CF(G)) is particularly high. Although depending on panel design, the display quality of the panel is considered to become more adversely affected as the sizes of the regions occupied by the areas 2203, 2205, and 2207 increase.

REFERENCE

Patent Document

[Patent Document 1] Japanese Published Patent Application No. 2007-012370

SUMMARY OF THE INVENTION

An object of one embodiment of the present invention is to inhibit reflection of external light in display devices.

One embodiment of the present invention is a display device which includes a reflective electrode layer; a partition formed to surround the reflective electrode layer; a layer containing a light-emitting organic compound and formed over the partition and the reflective electrode layer; a semi-transmissive electrode layer formed over the layer containing the light-emitting organic compound; and a coloring layer formed over the semi-transmissive electrode layer. The coloring layer overlaps with the reflective electrode layer and the partition. The partition does not overlap with the reflective electrode layer.

It is preferable that the above embodiment of the present invention include a transparent electrode layer formed between the reflective electrode layer and the layer containing the light-emitting organic compound, and that the optical path length of a microcavity be adjusted to a value suitable for an emission color of a pixel by adjusting the thickness of the transparent electrode layer.

One embodiment of the present invention is a display device which includes a reflective electrode layer formed over an insulating layer; a transparent electrode layer formed over the reflective electrode layer and the insulating layer; a partition formed over the transparent electrode layer and formed to surround the reflective electrode layer; a layer containing a light-emitting organic compound and formed over the partition and the transparent electrode layer; a semi-transmissive electrode layer formed over the layer containing the light-emitting organic compound; and a coloring layer formed over the semi-transmissive electrode layer. The optical path length of a microcavity is adjusted to a value suitable for an emission color of a pixel by adjusting the thickness of the transparent electrode layer. The coloring layer overlaps with the reflective electrode layer, the transparent electrode layer, and the partition. The partition does not overlap with the reflective electrode layer.

One embodiment of the present invention is a display device which includes a reflective electrode layer; a transparent electrode layer formed over the reflective electrode layer; a partition formed to surround the transparent electrode layer and the reflective electrode layer; a layer containing a light-emitting organic compound and formed over the partition and the transparent electrode layer; a semi-transmissive electrode layer formed over the layer containing the light-emitting organic compound; and a coloring layer formed over the semi-transmissive electrode layer. The optical path length of a microcavity is adjusted to a value suitable for an emission color of a pixel by adjusting the thickness of the transparent electrode layer. The coloring layer overlaps with the reflective electrode layer, the transparent electrode layer, and the partition. The partition does not overlap with the reflective electrode layer and the transparent electrode layer.

One embodiment of the present invention is a display device which includes a reflective electrode layer formed over an insulating layer; a transparent electrode layer formed over the reflective electrode layer and the insulating layer; a partition formed over the insulating layer and formed to surround the transparent electrode layer and the reflective electrode layer; a layer containing a light-emitting organic compound and formed over the partition and the transparent electrode layer; a semi-transmissive electrode layer formed over the layer containing the light-emitting organic compound; and a coloring layer formed over the semi-transmissive electrode layer. The optical path length of a microcavity is adjusted to a value suitable for an emission color of a pixel by adjusting the thickness of the transparent electrode layer. The coloring layer overlaps with the reflective electrode layer, the transparent electrode layer, and the partition. The partition does not overlap with the reflective electrode layer and the transparent electrode layer.

In the above embodiment of the present invention, an end portion of a pattern of the transparent electrode layer preferably has a tapered shape.

In the above embodiment of the present invention, the end portion of the pattern of the transparent electrode layer is preferably formed on an outer side than an end portion of a pattern of the reflective electrode layer.

One embodiment of the present invention is a display device which includes a first reflective electrode layer, a second reflective electrode layer, and a third reflective electrode layer; a first transparent electrode layer formed over the first reflective electrode layer; a second transparent electrode layer formed over the second reflective electrode layer; a third transparent electrode layer formed over the third reflective electrode layer; a partition formed to surround the first reflective electrode layer and the first transparent electrode layer, the second reflective electrode layer and the second transparent electrode layer, and the third reflective electrode layer and the third transparent electrode layer; a layer containing a light-emitting organic compound and formed over the partition, the first transparent electrode layer, the second transparent electrode layer, and the third transparent electrode layer; a semi-transmissive electrode layer formed over the layer containing the light-emitting organic compound; and a first coloring layer, a second coloring layer, and a third coloring layer formed over the semi-transmissive electrode layer. The optical path length of a microcavity is adjusted to a value suitable for an emission color of a pixel by adjusting the thickness of each of the first transparent electrode layer, the second transparent electrode layer, and the third transparent electrode layer. The first coloring layer overlaps with the first reflective electrode layer, the first transparent electrode layer, and the partition. The second coloring layer overlaps with the second reflective electrode layer, the second transparent electrode layer, and the partition. The third coloring layer overlaps with the third reflective electrode layer, the third transparent electrode layer, and the partition. The partition does not overlap with the first reflective electrode layer, the second reflective electrode layer, and the third reflective electrode layer.

One embodiment of the present invention is an electronic device including the above-described display device.

By application of one embodiment of the present invention, reflection of external light in display devices can be inhibited.

DETAILED DESCRIPTION OF THE INVENTION

Hereinafter, embodiments of the present invention will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

[Embodiment 1]

In this embodiment, a display device of one embodiment of the present invention will be described with reference to FIGS. 1A and 1B.

Figure 1A:
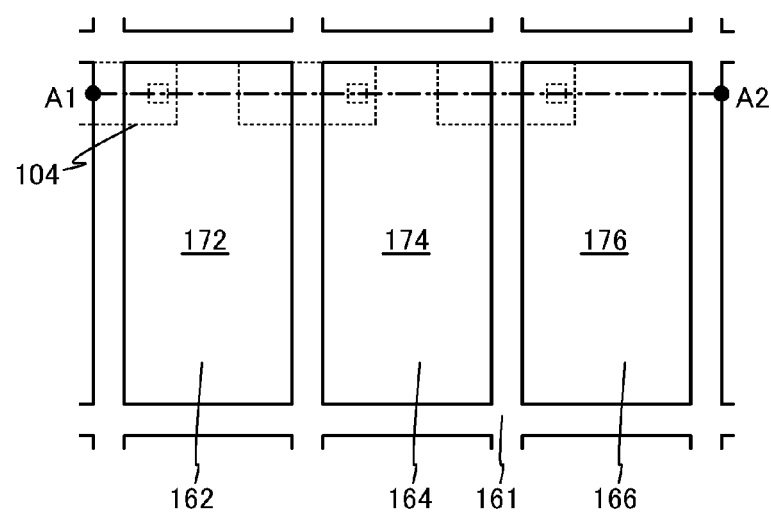
FIGS. 1A and 1B illustrate a display device of one embodiment of the present invention.
Figure 1B:
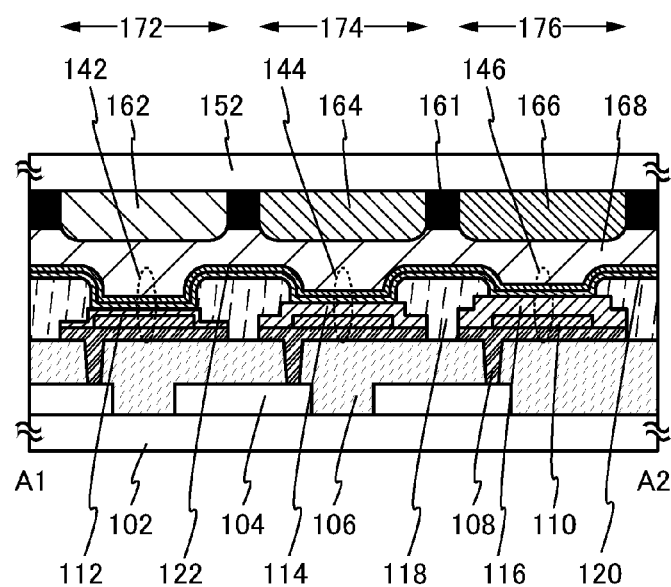

A structure example of a display device in this embodiment is illustrated in FIGS. 1A and 1B. FIG. 1A is a top view illustrating part of a pixel portion of the display device, and FIG. 1B is a cross-sectional view taken along dashed-dotted line A1-A2 in FIG. 1A. Note that for simplification of the drawing, some components are illustrated in a see-through manner or not illustrated in the top view in FIG. 1A.

FIG. 1A illustrates part of a pixel portion of the display device, in which pixel patterns of red (R), green (G), and blue (B) are arranged in matrix, for example, and each pixel pattern includes a thin film transistor (TFT) which serves as a switching element for switching an on state and an off state of a pixel. Note that although the pixel patterns of red (R), green (G), and blue (B) are described as examples, pixel patterns of four or more colors may be alternatively employed.

In this embodiment, each pixel pattern includes a B pixel region 172, a G pixel region 174, or an R pixel region 176. Between the pixel patterns, a light-blocking portion 161 serving as a black matrix is formed.

The display device illustrated in FIGS. 1A and 1B includes a first substrate 102 and a second substrate 152. The TFTs and an element portion including a light-emitting element and the like are formed over the first substrate 102. A coloring layer serving as what is called a color filter, and the like are provided on the second substrate 152. Note that the first substrate 102 and the second substrate 152, which face each other, are sealed such that there is a space 168 therebetween. Although not shown in FIGS. 1A and 1B, a wiring pattern or the like which is electrically connected to a TFT 104 may be further provided.

When external light enters the display device, the external light is reflected off a glass substrate surface of the pixel portion, an interface with the light-emitting element formed in the pixel portion, or a surface of a reflective electrode or the like, for example. By a reduction in reflection of external light in the pixel portion, a display device with high display quality can be provided. Specifically, it is effective to reduce the reflectance in a region where the reflectance of external light is high in the pixel portion.

In this embodiment, for example, a structure illustrated in FIG. 1B can be employed to reduce the above-described reflection of external light. The display device illustrated in FIG. 1B includes the first substrate 102; the TFT 104 formed over the first substrate 102; a planarization layer 106 formed over the TFT 104; a conductive layer 108 formed over the planarization layer 106 and electrically connected to the TFT 104; a reflective electrode layer 110 formed over the conductive layer 108; a first transparent electrode layer 112 formed over the reflective electrode layer 110 in the B pixel region 172; a second transparent electrode layer 114 formed over the reflective electrode layer 110 in the G pixel region 174; a third transparent electrode layer 116 formed over the reflective electrode layer 110 in the R pixel region 176; a partition layer 118 formed over the first transparent electrode layer 112, the second transparent electrode layer 114, and the third transparent electrode layer 116 to surround the reflective electrode layer 110; a layer 120 (hereinafter also referred to as "EL layer") containing a light-emitting organic compound and formed over the partition layer 118, the first transparent electrode layer 112, the second transparent electrode layer 114, and the third transparent electrode layer 116; and a semi-transmissive electrode layer 122 formed over the EL layer 120. Note that in the present specification, the reflective electrode layer 110 formed in the B pixel region 172 may be referred to as a first reflective electrode layer, the reflective electrode layer 110 formed in the G pixel region 174 may be referred to as a second reflective electrode layer, and the reflective electrode layer 110 formed in the R pixel region 176 may be referred to as a third reflective electrode layer.

In FIG. 1B, the partition layer 118 does not overlap with the reflective electrode layer 110. In other words, an end portion of the partition layer 118 is formed on an outer side than an end portion of the reflective electrode layer 110. When the end portion of the partition layer 118 is formed on an outer side than the end portion of the reflective electrode layer 110, reflection of external light on the partition layer 118 can be reduced.

On the second substrate 152, a first coloring layer 162, a second coloring layer 164, a third coloring layer 166, and the light-blocking portion 161 provided between the first coloring layer 162, the second coloring layer 164, and the third coloring layer 166 are provided. Note that in this embodiment, the first coloring layer 162 can transmit light with a blue wavelength (e.g., a wavelength of 450 nm to 485 nm), the second coloring layer 164 can transmit light with a green wavelength (e.g., a wavelength of 500 nm to 565 nm), and the third coloring layer 166 can transmit light with a red wavelength (e.g., a wavelength of 600 nm to 740 nm), for example.

Note that in the B pixel region 172, the conductive layer 108, the reflective electrode layer 110, the first transparent electrode layer 112, the EL layer 120, and the semi-transmissive electrode layer 122 form a first light-emitting element 142. In the G pixel region 174, the conductive layer 108, the reflective electrode layer 110, the second transparent electrode layer 114, the EL layer 120, and the semi-transmissive electrode layer 122 form a second light-emitting element 144. In the R pixel region 176, the conductive layer 108, the reflective electrode layer 110, the third transparent electrode layer 116, the EL layer 120, and the semi-transmissive electrode layer 122 form a third light-emitting element 146.

In the first light-emitting element 142, the conductive layer 108, the reflective electrode layer 110, and the first transparent electrode layer 112 function as an anode, and the semi-transmissive electrode layer 122 functions as a cathode in this embodiment. In the second light-emitting element 144, the conductive layer 108, the reflective electrode layer 110, and the second transparent electrode layer 114 function as an anode, and the semi-transmissive electrode layer 122 functions as a cathode. In the third light-emitting element 146, the conductive layer 108, the reflective electrode layer 110, and the third transparent electrode layer 116 function as an anode, and the semi-transmissive electrode layer 122 functions as a cathode.

Note that the conductive layer 108 is not necessarily provided, and the reflective electrode layer 110 may be directly connected to the TFT 104.

In the first light-emitting element 142, the second light-emitting element 144, and the third light-emitting element 146, the reflective electrode layer 110 reflects light emitted from the EL layer 120, and the light is extracted from the semi-transmissive electrode layer 122 side. The first light-emitting element 142, the second light-emitting element 144, and the third light-emitting element 146 have a function as what is called a microcavity (micro optical resonator) in which light emitted from the EL layer 120 is resonated between the reflective electrode layer 110 and the semi-transmissive electrode layer 122.

The function as a microcavity can be adjusted by a material provided between the reflective electrode layer 110 and the semi-transmissive electrode layer 122, the thickness of the material, or the like. For example, the thicknesses of the first transparent electrode layer 112, the second transparent electrode layer 114, and the third transparent electrode layer 116 are adjusted in the first light-emitting element 142, the second light-emitting element 144, and the third light-emitting element 146, respectively. With this structure, the optical path length between the reflective electrode layer 110 and the semi-transmissive electrode layer 122 can differ between the light-emitting elements of blue, green, and red.

The thicknesses of the first transparent electrode layer 112, the second transparent electrode layer 114, and the third transparent electrode layer 116 may each be set such that the microcavity has an optical path length with which a spectrum necessary for each color (blue, green, or red) is amplified by a resonant effect.

Here, a pixel portion of a display device as a reference example and a cross-sectional structure of the pixel portion are described with reference to FIGS. 2A and 2B. Note that common reference numerals are used for components that have functions similar to functions described with reference to FIGS. 1A and 1B, and detailed descriptions of the components are omitted.

Figure 2A:
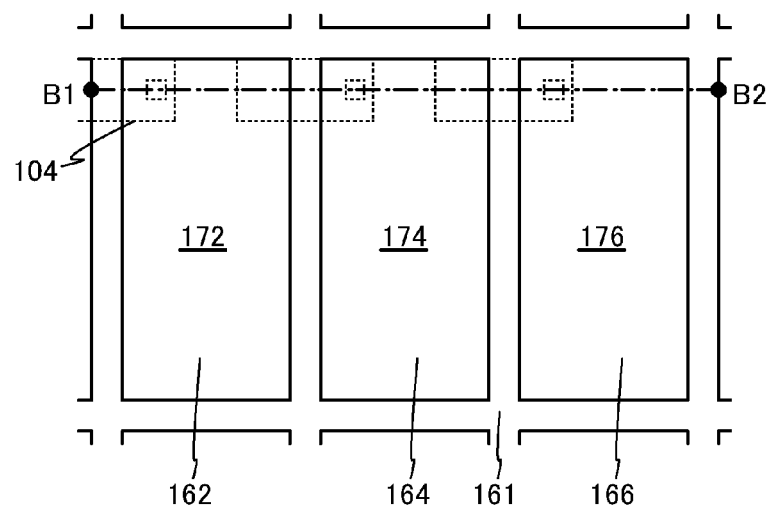
FIGS. 2A and 2B illustrate a display device as a reference example.
Figure 2B:
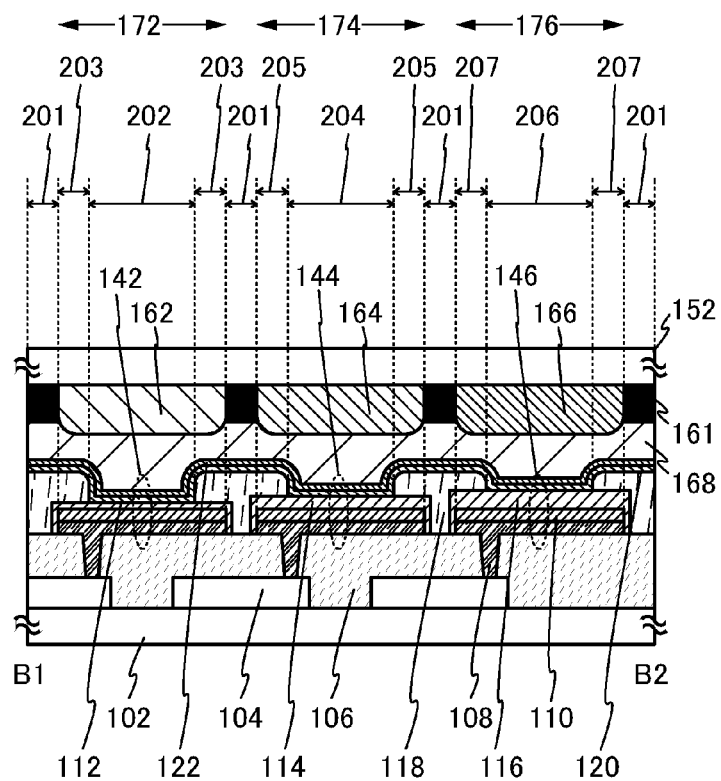

FIG. 2A is a top view illustrating part of a pixel portion of the display device, and FIG. 2B is a cross-sectional view taken along dashed-dotted line B1-B2 in FIG. 2A. Note that for simplification of the drawing, some components are illustrated in a see-through manner or not illustrated in the top view in FIG. 2A.

The display device illustrated in FIG. 2B includes the first substrate 102; the TFT 104 formed over the first substrate 102; the planarization layer 106 formed over the TFT 104; the conductive layer 108 formed over the planarization layer 106 and electrically connected to the TFT 104; the reflective electrode layer 110 formed over the conductive layer 108; the first transparent electrode layer 112 formed over the reflective electrode layer 110 in the B pixel region 172; the second transparent electrode layer 114 formed over the reflective electrode layer 110 in the G pixel region 174; the third transparent electrode layer 116 formed over the reflective electrode layer 110 in the R pixel region 176; the partition layer 118 formed over the first transparent electrode layer 112, the second transparent electrode layer 114, and the third transparent electrode layer 116; the EL layer 120 formed over the partition layer 118, the first transparent electrode layer 112, the second transparent electrode layer 114, and the third transparent electrode layer 116; and the semi-transmissive electrode layer 122 formed over the EL layer 120.

In FIG. 2B, the end portion of the partition layer 118 is formed on an inner side than the end portion of the reflective electrode layer 110. That is, the display device illustrated in FIG. 2B is different from the display device illustrated in FIG. 1B in the shape of the reflective electrode layer 110. In the display device illustrated in FIG. 2B, the reflective electrode layer 110 extends under the partition layer 118; thus, when external light enters this region, the optical path length between the reflective electrode layer 110 and the semi-transmissive electrode layer 122 is different due to the thickness of the partition layer 118.

Here, reflection of external light, which entered the display device illustrated in FIGS. 2A and 2B, in the B pixel region 172, the G pixel region 174, the R pixel region 176, and the light-blocking portion 161 was actually measured.

Note that in FIG. 2B, a portion where the light-blocking portion 161 is formed is denoted as a region 201; the central portion of the B pixel region 172 where the partition layer 118 is not formed is denoted as a region 202; the central portion of the G pixel region 174 where the partition layer 118 is not formed is denoted as a region 204; the central portion of the R pixel region 176 where the partition layer 118 is not formed is denoted as a region 206; an end portion of the B pixel region 172 where the partition layer 118 is formed is denoted as a region 203; an end portion of the G pixel region 174 where the partition layer 118 is formed is denoted as a region 205; and an end portion of the R pixel region 176 where the partition layer 118 is formed is denoted as a region 207.

Figure 3:
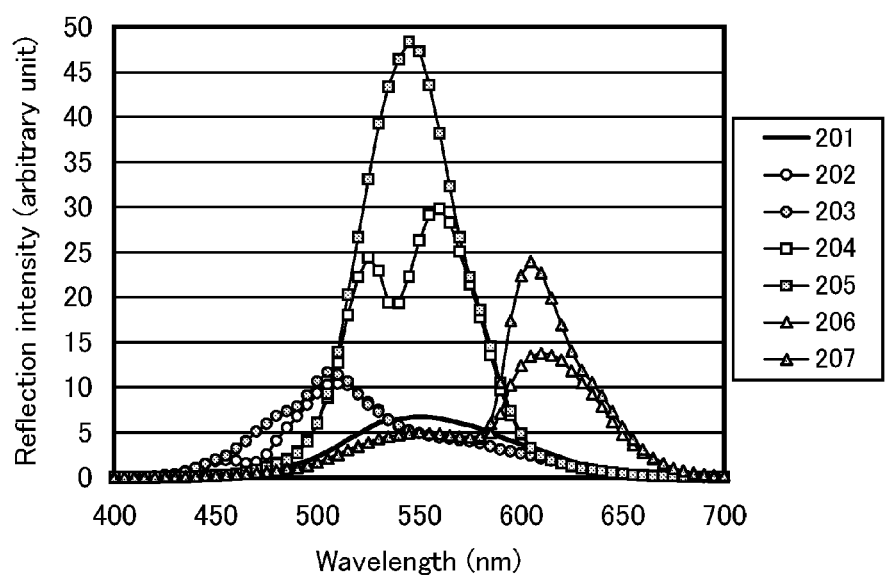
FIG. 3 shows measurement results of reflection intensities of a display device as a reference example.

FIG. 3 shows the measurement results of reflection intensities.

Note that FIG. 3 shows the measurement results of reflection intensities of the respective regions. In FIG. 3, the horizontal axis represents wavelength (nm), and the vertical axis represents reflection intensity (arbitrary unit).

Figure 12:
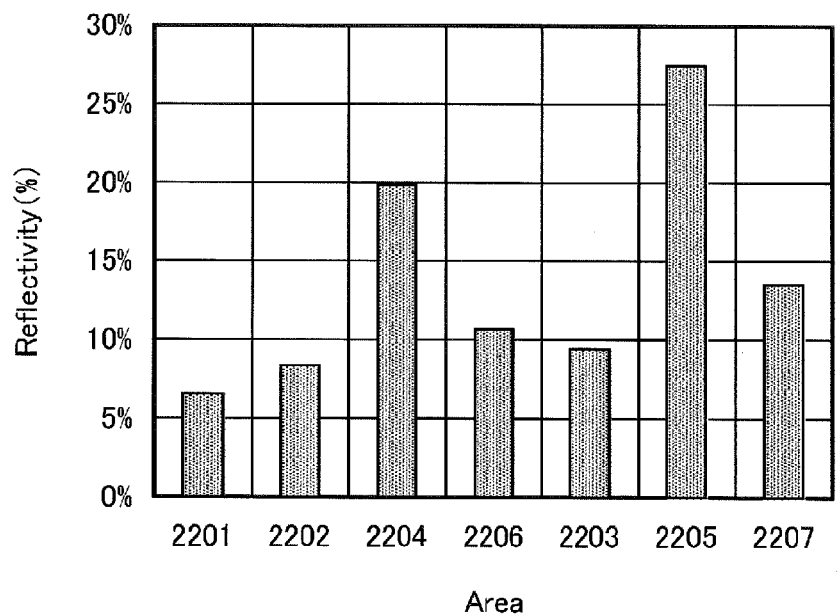
FIG. 12 shows measurement results of reflectances in a conventional display device.

The reflectances in the regions 201, 202, 204, 206, 203, 205, and 207 illustrated in FIG. 2B are probably similar to those of the areas 2201, 2202, 2204, 2206, 2203, 2205, and 2207 in FIG. 12, respectively. More specifically, reflectances in the regions 201, 202, 204, 206, 203, 205, and 207 are 6.5%, 8.4%, 19.8%, 10.7%, 9.4%, 27.5%, and 13.6%, respectively.

As shown in FIG. 3, in each of the central portions where the partition layer 118 is not formed, light transmitted through the coloring layer is reduced by the function of the microcavity. It is found that a reflection intensity is high in an end portion of each of the pixel patterns that does not have a function of an appropriate microcavity, i.e., a region where the reflective electrode layer 110 and the partition layer 118 overlap with each other. Specifically, the region 205 has a high reflection intensity.

From FIG. 3 and the reflectances in the regions in FIG. 12, it is found that a reflectance and a reflection intensity are higher in the end portion of the pixel, i.e., a region where the partition layer 118 is formed over the reflective electrode layer 110, than in the central portion of the pixel. Both the reflectance and the reflection intensity are higher in the region 205, namely, the end portion of the G pixel region 174, than in the end portions of the other pixel regions.

However, in the display device of one embodiment of the present invention illustrated in FIG. 1B, since the partition layer 118 is not formed over the reflective electrode layer 110, the reflectances and reflection intensities in the end portions of the pixels can be low. It is thus possible to provide an excellent display device in which reflection of external light is reduced.

Note that in the display device illustrated in FIG. 1B, the reflective electrode layer 110 in each of the pixels (e.g., the B pixel region 172, the G pixel region 174, and the R pixel region 176) is provided on inner sides than the end portions of the partition layer 118; however, the present invention is not limited to this example. For example, only the reflective electrode layer 110 in the G pixel region 174 may be provided on inner sides than the end portions of the partition layer 118, in which case an excellent display device with less reflection of external light can be provided. Still, it is preferable that the partition layer 118 be not provided over the reflective electrode layer 110 in any of the pixels as described in this embodiment.

The structure described in this embodiment can be used in appropriate combination with any of the structures described in the other embodiments.

Next, a method for fabricating the display device illustrated in FIG. 1B is described with reference to FIGS. 4A to 4D, FIGS. 5A to 5D, FIGS. 6A to 6D, and FIGS. 7A to 7D.

First, the TFT 104 and the planarization layer 106 are formed over the first substrate 102 by a known method. Then, contact holes are formed in the planarization layer 106 (see FIG. 4A).

As the TFT 104, any of various transistors such as bottom-gate transistors and top-gate transistors can be used. Note that any of various semiconductors can be used for regions where channels of these transistors are formed. Specifically, an oxide semiconductor or the like can be used as well as amorphous silicon, polysilicon, and single crystal silicon. As an example of an oxide semiconductor, an oxide semiconductor containing at least indium (In) or zinc (Zn) can be given, and an oxide semiconductor containing In and Zn is preferable. An oxide semiconductor containing gallium (Ga) or tin (Sn) or both is particularly preferable.

As the planarization layer 106, an insulating layer, such as an organic resin film, can be used. For the organic resin film, an acrylic-based resin, a polyimide-based resin, or the like can be favorably used.

Figure 4A:
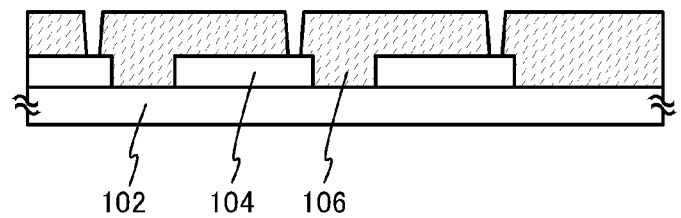
FIGS. 4A to 4D illustrate a method for fabricating a display device of one embodiment of the present invention.
Figure 4B:
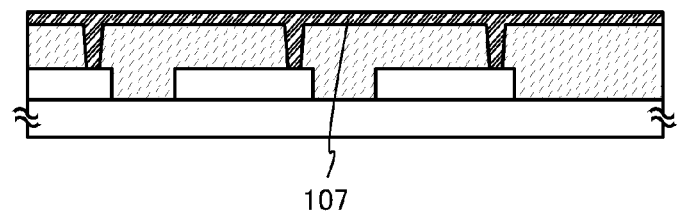

Then, a conductive film 107 is formed to fill the contact holes and to be electrically connected to the TFT 104 (see FIG. 4B).

The conductive film 107 can be formed to a thickness of 100 nm by a known sputtering method using ITO ($In_2O_3$ doped with $SnO_2$), for example. An ITO film is a transparent conductive film with high light transmittance.

Figure 4C:
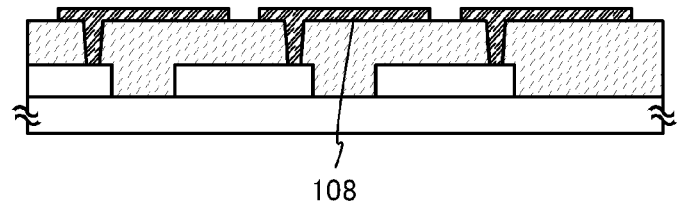

Next, a desired pattern is formed over the conductive film 107 and unnecessary regions are removed by etching, so that the conductive layer 108 is formed (see FIG. 4C).

The conductive film 107 is patterned in the following manner, for example. A photoresist (OFPR800 manufactured by Tokyo Ohka Kogyo Co., Ltd. (the same applies to the photoresists below) is applied by a spin coating method. The revolution number and time for the spin coating can be set to 1000 rpm and 20 seconds, respectively. Prebaking is performed using a hot plate at 100° C. for 2 minutes, followed by postbaking at 140° C. for 3 minutes. Then, patterning light exposure is performed on a desired position by a g- and h-line stepper, and immersion in 2.38% tetramethylammonium hydroxide (TMAH) is performed for 2 minutes. Then, the substrate is washed with pure water and dried by $N_2$ blow. Thus, the desired pattern can be formed.

Etching of the conductive film 107 may be performed in the following manner, for example. The substrate provided with the desired pattern is immersed in an aqueous solution of ferric chloride in a thermostatic oven maintained at 35° C. for 5 minutes to etch the conductive film 107, and the substrate is washed with water. The photoresist is then removed in such a manner that, for example, the substrate is immersed in dimethyl sulfoxide (DMSO) in a thermostatic oven heated to 40° C. for 30 minutes, then washed with water and dried.

Figure 4D:
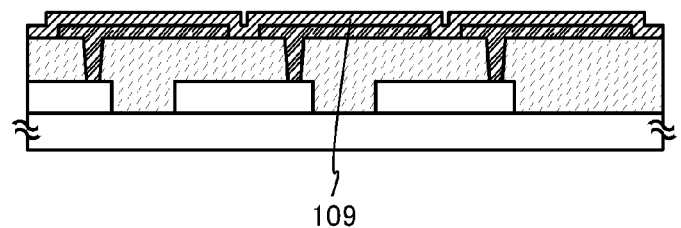

Next, a conductive film 109 is formed over the planarization layer 106 and the conductive layer 108 (see FIG. 4D).

For example, the conductive film 109 can be formed to a thickness of 100 nm by a known sputtering method using an APC alloy (an Ag—Pd—Cu alloy, APC-TR manufactured by FURUYA METAL Co., Ltd.)

Figure 5A:
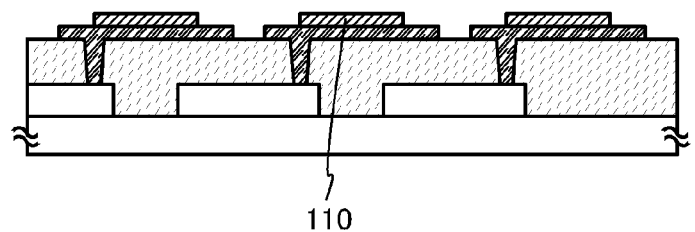
FIGS. 5A to 5D illustrate a method for fabricating a display device of one embodiment of the present invention.

Next, a desired photoresist pattern is formed over the conductive film 109 and unnecessary regions are removed by etching, so that the reflective electrode layer 110 is formed (see FIG. 5A).

The conductive film 109 can be patterned by a treatment similar to the treatment performed to pattern the conductive film 107 above. Over the conductive film 109, the pattern is preferably formed on inner sides than end portions of the pattern of the conductive layer 108 by 5 µm each.

The conductive film 109 can be etched, for example, by immersing the substrate in a commercially available etchant (SEA-1 manufactured by KANTO CHEMICAL CO., INC.) maintained at 30° C. in a thermostatic oven for 2 minutes. It is preferable that the substrate be washed with water after the etching. The photoresist is then removed in such a manner that, for example, the substrate is immersed in dimethyl sulfoxide (DMSO) in a thermostatic oven heated to 40° C. for 30 minutes, then washed with water and dried.

Figure 5B:
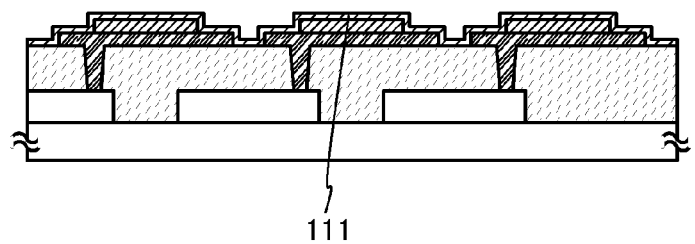

Then, a conductive film 111 is formed over the planarization layer 106, the conductive layer 108, and the reflective electrode layer 110 (see FIG. 5B).

For example, as the conductive film 111, an ITO film can be formed to a thickness of 20 nm by a known sputtering method.

Figure 5C:
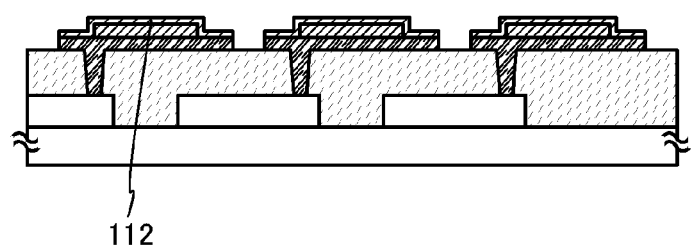

Next, a desired pattern is formed over the conductive film 111 and unnecessary regions are removed by etching, so that the first transparent electrode layer 112 is formed (see FIG. 5C).

The conductive film 111 can be patterned by a treatment similar to the treatment performed to pattern the conductive film 107 above. Over the conductive film 111, the pattern is preferably formed so as to be substantially aligned with the end portion of the pattern of the conductive layer 108.

The conductive film 111 can be etched in a manner similar to that of the conductive film 107.

Figure 5D:
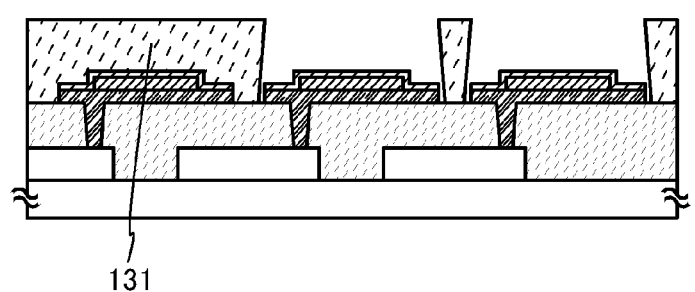

Then, a mask 131 is formed in a region other than the G pixel region 174 and the R pixel region 176 (see FIG. 5D).

For example, the mask 131 can be formed by applying a commercially available resist (ZPN2464 manufactured by ZEON CORPORATION) that will have a reverse-tapered profile by a spin coating method with the rotation number and time of the substrate set to 1100 rpm and 20 seconds, respectively. After that, prebaking is performed using a hot plate at 110° C. for 90 seconds, light exposure is performed by a g- and h-line stepper, postbaking is performed using a hot plate at 115° C. for 1 minute, and development is performed using 2.38% TMAH for 80 seconds. Then, baking is performed using a hot plate at 150° C. for 3 minutes.

Figure 6A:
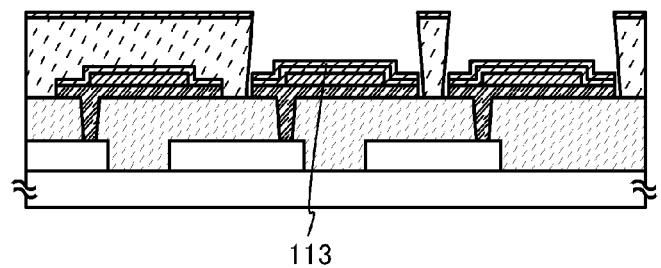
FIGS. 6A to 6D illustrate a method for fabricating a display device of one embodiment of the present invention.
Figure 6B:
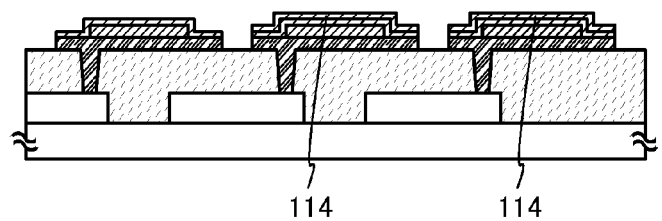

Next, a conductive film 113 is formed over the first transparent electrode layer 112 and the mask 131 (see FIG. 6A).

For example, the conductive film 113 is preferably formed using an ITO film, which is also used for the conductive film 107 and the conductive film 111, and the thickness can be set to 40 nm.

Then, an ashing treatment using oxygen plasma is performed, and the mask 131 is removed by a lift-off method. Thus, the second transparent electrode layer 114 is formed in each of the G pixel region 174 and the R pixel region 176 (see FIG. 6B).

Figure 6C:
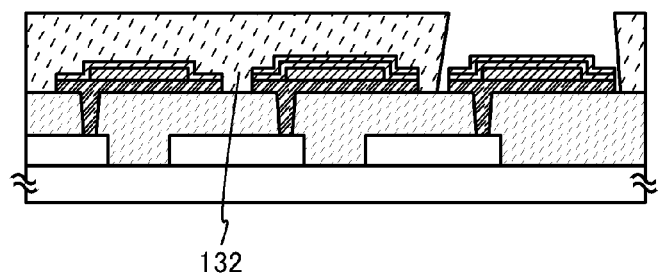

Then, a mask 132 is formed in a region other than the R pixel region 176 (see FIG. 6C).

The mask 132 can be formed in a manner similar to that for forming the mask 131 above.

Figure 6D:
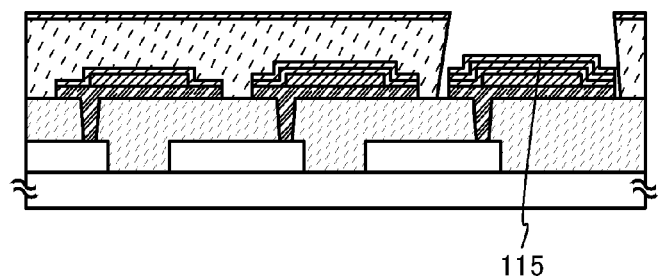

Next, a conductive film 115 is formed over the second transparent electrode layer 114 and the mask 132 (see FIG. 6D).

For example, the conductive film 115 is preferably formed using an ITO film, which is also used for the conductive film 107, the conductive film 111, and the conductive film 113, and the thickness can be set to 40 nm.

Then, an ashing treatment using oxygen plasma is performed, and the mask 132 is removed by a lift-off method. Thus, the third transparent electrode layer 116 is formed in the R pixel region 176 (see FIG. 7A).

Figure 7A:
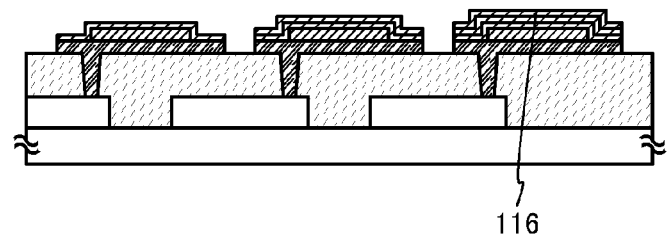
FIGS. 7A to 7D illustrate a method for fabricating a display device of one embodiment of the present invention.
Figure 7B:
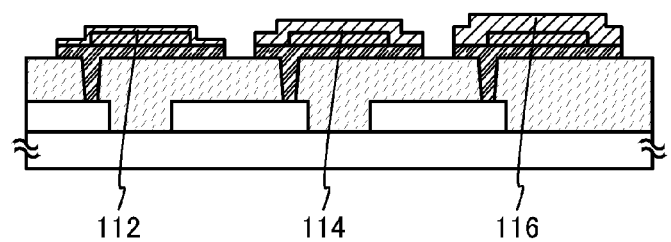

Through the above steps, the first transparent electrode layer 112, the second transparent electrode layer 114, and the third transparent electrode layer 116 are formed in the B pixel region 172, the G pixel region 174, and the R pixel region 176, respectively (see FIG. 7B).

Note that in this embodiment, since the first transparent electrode layer 112, the second transparent electrode layer 114, and the third transparent electrode layer 116 each include stacked layers of the same kind of material, i.e., ITO, the interfaces therebetween cannot be clearly defined in some cases. Thus, the regions around the interfaces are integrally illustrated in FIG. 7B and the drawings illustrating the subsequent steps. The thickness of the transparent electrode layer over the reflective electrode layer 110 differs between the pixels accordingly. The ITO of the first transparent electrode layer 112, that of the second transparent electrode layer 114, and that of the third transparent electrode layer 116 can have thicknesses of 20 nm, 60 nm, and 100 nm, respectively.

In addition, through the above steps, the reflective electrode layer 110 is provided between the conductive layer 108 and the first transparent electrode layer 112 in the B pixel region 172; the reflective electrode layer 110 is provided between the conductive layer 108 and the second transparent electrode layer 114 in the G pixel region 174; and the reflective electrode layer 110 is provided between the conductive layer 108 and the third transparent electrode layer 116 in the R pixel region 176. In each of the pixel regions, the pattern width of the reflective electrode layer is smaller than that of the transparent electrode layer.

Figure 7C:
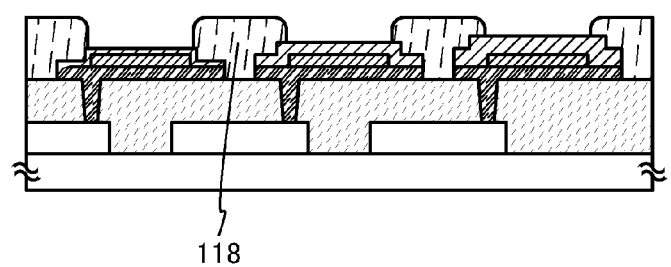

Next, the partition layer 118 is formed over the planarization layer 106, the first transparent electrode layer 112, the second transparent electrode layer 114, and the third transparent electrode layer 116 (see FIG. 7C).

For example, the partition layer 118 can be formed by the following method: a commercially available acrylic resin (JAS100 manufactured by JSR Corporation) is applied by a spin coating method with the rotation number and time of the substrate set to 1000 rpm and 15 seconds, respectively; prebaking is performed at 100° C. for 3 minutes; and patterning light exposure is performed by a g- and h-line stepper. After the patterning light exposure, the substrate is immersed in 2.38% TMAH for 2 minutes, washed with water, and then preferably baked in an air oven at 200° C. for 1 hour.

Note that the partition layer 118 is formed so that the pattern of the end portion of the reflective electrode layer 110 and the partition layer 118 do not overlap with each other. For example, the partition layer 118 is preferably formed to be aligned with the pattern of the end portion of the reflective electrode layer 110 or to be on an outer side than the pattern of the end portion of the reflective electrode layer 110 by approximately 1 μm to 2 μm (in other words, the distance between the end portion of the partition layer 118 and the end portion of the reflective electrode layer 110 is preferably approximately 1 μm to 2 μm).

Figure 7D:
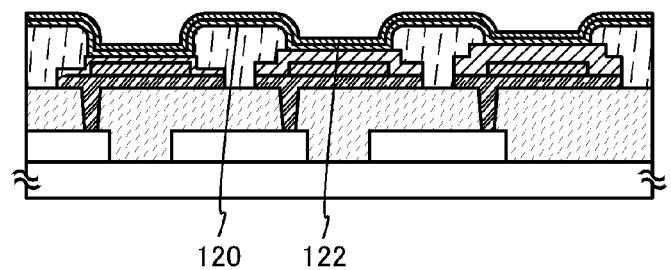

Then, the EL layer 120 and the semi-transmissive electrode layer 122 are formed over the first transparent electrode layer 112, the second transparent electrode layer 114, the third transparent electrode layer 116, and the partition layer 118 (see FIG. 7D).

Details about the EL layer 120 and the semi-transmissive electrode layer 122 are described in Embodiment 3, which shows a structure example of a light-emitting element.

Through the above steps, the light-emitting element can be formed over the first substrate 102.

Next, the first substrate 102 and the second substrate 152 are fitted with each other to perform sealing; thus, the display device illustrated in FIG. 1B can be fabricated.

Note that there is no particular limitation on the space 168 between the first substrate 102 and the second substrate 152 as long as the space 168 transmits light. It is preferable that the space 168 be filled with a light-transmitting material the refractive index of which is higher than that of the air. In the case where the refractive index is low, light emitted from the EL layer 120 in an oblique direction is further refracted by the space 168, and light is emitted from an adjacent pixel in some cases. Thus, for example, the space 168 can be filled with a light-transmitting adhesive having a high refractive index and capable of bonding the first substrate 102 and the second substrate 152 to each other. Alternatively, an inert gas such as nitrogen or argon or the like can be used.

In this embodiment, since the reflective electrode layer 110 is not formed under the partition layer 118 as described above, surface reflection of the panel in the pixel portion can be considerably reduced. Further, the partition layer 118 is not formed over the pattern of the reflective electrode layer 110, but is formed over end portions of patterns of the first transparent electrode layer 112, the second transparent electrode layer 114, and the third transparent electrode layer 116; accordingly, leakage current at the electrode end portions or a short circuit between the electrodes can be prevented.

The structure described in this embodiment can be used in appropriate combination with any of the structures described in the other embodiments.

[Embodiment 2]

In this embodiment, as display devices of embodiments of the present invention, variations of the structure that is described in Embodiment 1 will be described with reference to FIGS. 8A and 8B and FIG. 9. Note that common reference numerals are used for components that have functions similar to functions described in Embodiment 1, and detailed descriptions of the components are omitted.

Figure 8A:
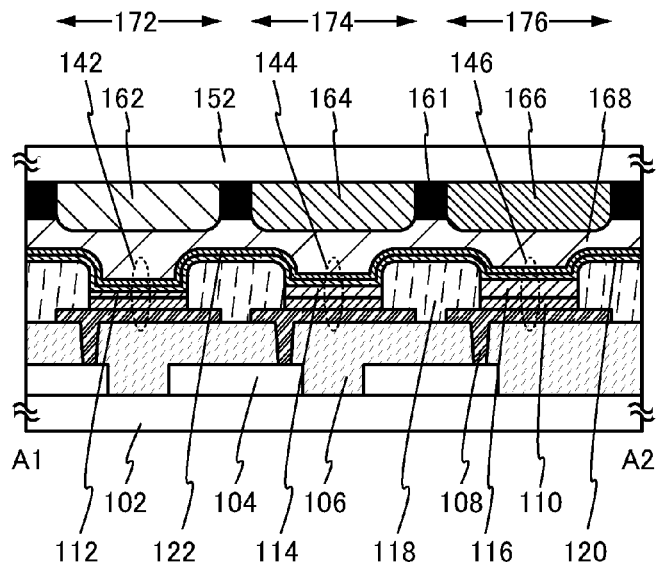
FIGS. 8A and 8B illustrate variations of a display device of one embodiment of the present invention.

A display device illustrated in FIG. 8A includes the first substrate 102; the TFT 104 formed over the first substrate 102; the planarization layer 106 formed over the TFT 104; the conductive layer 108 formed over the planarization layer 106 and electrically connected to the TFT 104; the reflective electrode layer 110 formed over the conductive layer 108; the first transparent electrode layer 112 formed over the reflective electrode layer 110 in the B pixel region 172; the second transparent electrode layer 114 formed over the reflective electrode layer 110 in the G pixel region 174; the third transparent electrode layer 116 formed over the reflective electrode layer 110 in the R pixel region 176; the partition layer 118 formed on side surfaces of the first transparent electrode layer 112, the second transparent electrode layer 114, and the third transparent electrode layer 116 and over the conductive layer 108 and the planarization layer 106 to surround the reflective electrode layer 110 and the first, second, and third transparent electrode layers 112, 114, and 116; the EL layer 120 formed over the partition layer 118, the first transparent electrode layer 112, the second transparent electrode layer 114, and the third transparent electrode layer 116; and the semi-transmissive electrode layer 122 formed over the EL layer 120.

In the B pixel region 172, the conductive layer 108, the reflective electrode layer 110, the first transparent electrode layer 112, the EL layer 120, and the semi-transmissive electrode layer 122 form the first light-emitting element 142. In the G pixel region 174, the conductive layer 108, the reflective electrode layer 110, the second transparent electrode layer 114, the EL layer 120, and the semi-transmissive electrode layer 122 form the second light-emitting element 144. In the R pixel region 176, the conductive layer 108, the reflective electrode layer 110, the third transparent electrode layer 116, the EL layer 120, and the semi-transmissive electrode layer 122 form the third light-emitting element 146.

In FIG. 8A, the partition layer 118 does not overlap with the reflective electrode layer 110 and the first, second, and third transparent electrode layers 112, 114, and 116. In other words, the end portion of the partition layer 118 is formed along end portions of the reflective electrode layer 110 and the first, second, or third transparent electrode layer 112, 114, or 116 or on outer sides than the end portions. When the end portion of the partition layer 118 is formed along the end portion of the reflective electrode layer 110 or on an outer side than the end portion, reflection of external light on the partition layer 118 can be reduced.

For details about the second substrate 152 and the light-blocking portion 161, the first coloring layer 162, the second coloring layer 164, and the third coloring layer 166 that are formed on the second substrate 152, Embodiment 1 can be referred to.

The display device illustrated in FIG. 8A is different from the display device illustrated in FIG. 1B in the shapes of the first transparent electrode layer 112, the second transparent electrode layer 114, and the third transparent electrode layer 116. Specifically, in the display device illustrated in FIG. 8A, the end portions of the patterns of the first transparent electrode layer 112, the second transparent electrode layer 114, and the third transparent electrode layer 116 each are substantially aligned with the end portion of the pattern of the reflective electrode layer 110.

Because of the difference in the shapes of the first transparent electrode layer 112, the second transparent electrode layer 114, and the third transparent electrode layer 116, the display device illustrated in FIG. 8A is also different from the display device illustrated in FIG. 1B in the position of the partition layer 118.

A method for fabricating the display device illustrated in FIG. 8A is described with reference to the description of the method for fabricating the display device in FIG. 1B.

First, as in the fabrication of the display device in FIG. 1B, the components up to those illustrated in FIG. 4C are formed.

Then, a conductive film for forming the reflective electrode layer 110 is formed. For example, as the conductive film, a stacked film composed of a molybdenum (Mo) layer and an aluminum (Al) layer can be used. The molybdenum layer and aluminum layer can be each formed to a thickness of 100 nm by a known sputtering method, for example.

Next, a conductive film for forming the first transparent electrode layer 112, the second transparent electrode layer 114, and the third transparent electrode layer 116 is formed over the aluminum layer. The conductive film can be formed to a thickness of 20 nm by a known sputtering method using IZO ($In_2O_3$ doped with ZnO), for example.

Then, a photoresist pattern is formed in a predetermined region, and the stacked film composed of the molybdenum layer, the aluminum layer, and the IZO film is etched. Note that in the structure illustrated in FIG. 8A, the reflective electrode layer 110 and the first, second, or third transparent electrode layer 112, 114, or 116 are each formed on inner sides than the end portions of the conductive layer 108. However, the present invention is not limited to this structure; for example, the above electrode layers may be formed to have a pattern similar to that of the conductive layer 108.

The molybdenum layer, the aluminum layer, and the IZO film can be etched by immersing the substrate in a commercially available SLA etchant (manufactured by HAYASHI PURE CHEMICAL IND., LTD.) maintained at 30° C. in a thermostatic oven for 3 minutes. After the etching treatment, the substrate is washed with water. After the washing treatment, the substrate is immersed in a commercially available oxalic acid maintained at 30° C. in a thermostatic oven for 5 minutes and then washed with water. Then, the photoresist is removed; here, a method similar to that used in the above embodiment can be used.

Then, as in the above embodiment, a mask is formed using a reverse tapered resist in a region other than the G pixel region 174 and the R pixel region 176. An IZO film is then formed to a thickness of 40 nm by a known sputtering method. After that, the reverse tapered resist is removed by a lift-off method (see FIG. 5D, FIG. 6A, and FIG. 6B). At this time, an end portion of the reverse tapered resist pattern is substantially aligned with the end portion of the pattern of the reflective electrode layer 110.

Then, as in the above embodiment, a mask is formed using a reverse tapered resist in a region other than the R pixel region 176. An IZO film is then formed to a thickness of 40 nm by a known sputtering method. After that, the reverse tapered resist is removed by a lift-off method (see FIG. 6C, FIG. 6D, and FIG. 7A). At this time, an end portion of the reverse tapered resist pattern is substantially aligned with the end portion of the pattern of the reflective electrode layer 110.

Through the above steps, in the B pixel region 172, the first transparent electrode layer 112 is formed over the reflective electrode layer 110 in substantially the same position as that of the reflective electrode layer 110. In the G pixel region 174, the second transparent electrode layer 114 is formed over the reflective electrode layer 110 in substantially the same position as that of the reflective electrode layer 110. In the R pixel region 176, the third transparent electrode layer 116 is formed over the reflective electrode layer 110 in substantially the same position as that of the reflective electrode layer 110. In this embodiment, the IZO film of the first transparent electrode layer 112 has a thickness of 20 nm, the IZO film of the second transparent electrode layer 114 has a thickness of 60 nm, and the IZO film of the third transparent electrode layer 116 has a thickness of 100 nm.

Next, as in the above embodiment, the partition layer 118, the EL layer 120, and the semi-transmissive electrode layer 122 are formed (see FIGS. 7C and 7D). The first substrate 102 and the second substrate 152 are then fitted to each other to perform sealing; thus, the display device illustrated in FIG. 8A can be fabricated.

Figure 8B:
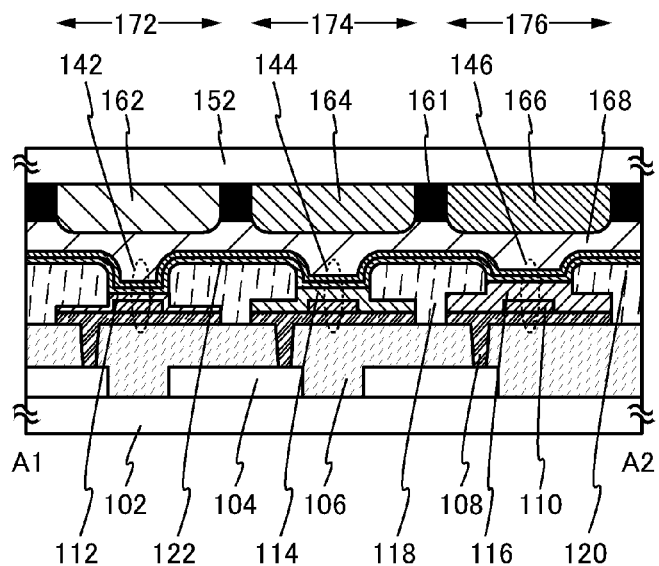

Next, a display device illustrated in FIG. 8B is described below.

The display device illustrated in FIG. 8B, which is a variation of the display device illustrated in FIG. 1B, is different from the display device illustrated in FIG. 1B in the shape of the reflective electrode layer 110. Specifically, the reflective electrode layer 110 is smaller than that in the structure illustrated in FIG. 1B.

For example, the reflective electrode layer 110 may be formed on inner sides than the end portions of the patterns of the conductive layer 108 by 8 μm.

When the reflective electrode layer 110 has such a shape, light emission from the EL layer 120 can be extracted from both the first substrate 102 side and the second substrate 152 side, for example. In other words, what is called a dual-emission display device can also be provided.

Figure 9:
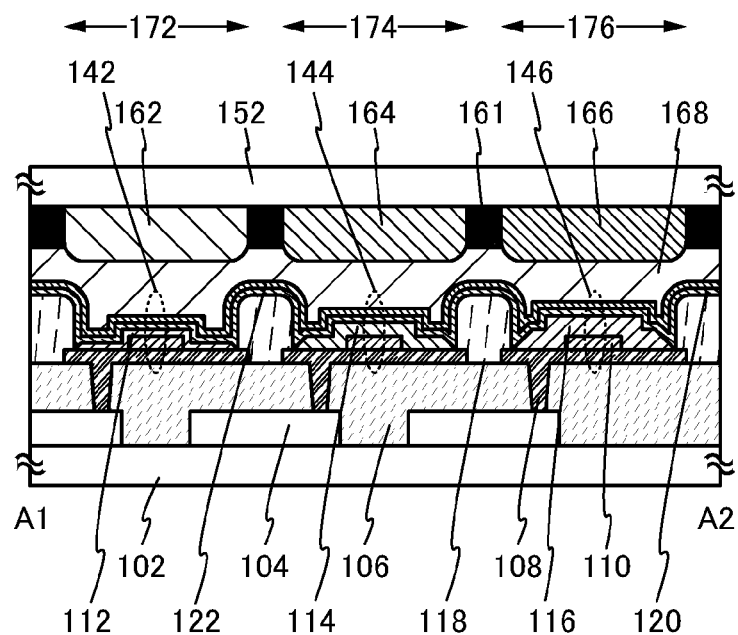
FIG. 9 illustrates a variation of a display device of one embodiment of the present invention.

Next, a display device illustrated in FIG. 9 is described below.

The display device illustrated in FIG. 9 includes the first substrate 102; the TFT 104 formed over the first substrate 102; the planarization layer 106 formed over the TFT 104; the conductive layer 108 formed over the planarization layer 106 and electrically connected to the TFT 104; the reflective electrode layer 110 formed over the conductive layer 108; the first transparent electrode layer 112 formed over the reflective electrode layer 110 in the B pixel region 172; the second transparent electrode layer 114 formed over the reflective electrode layer 110 in the G pixel region 174; the third transparent electrode layer 116 formed over the reflective electrode layer 110 in the R pixel region 176; the partition layer 118 formed above end portions of the first transparent electrode layer 112, the second transparent electrode layer 114, and the third transparent electrode layer 116 and over the conductive layer 108 and the planarization layer 106 to surround the reflective electrode layer 110 and the first, second, and third transparent electrode layers 112, 114, and 116; the EL layer 120 formed over the partition layer 118, the first transparent electrode layer 112, the second transparent electrode layer 114, and the third transparent electrode layer 116; and the semi-transmissive electrode layer 122 formed over the EL layer 120.

In the B pixel region 172, the conductive layer 108, the reflective electrode layer 110, the first transparent electrode layer 112, the EL layer 120, and the semi-transmissive electrode layer 122 form the first light-emitting element 142. In the G pixel region 174, the conductive layer 108, the reflective electrode layer 110, the second transparent electrode layer 114, the EL layer 120, and the semi-transmissive electrode layer 122 form the second light-emitting element 144. In the R pixel region 176, the conductive layer 108, the reflective electrode layer 110, the third transparent electrode layer 116, the EL layer 120, and the semi-transmissive electrode layer 122 form the third light-emitting element 146.

In FIG. 9, the partition layer 118 does not overlap with the reflective electrode layer 110 and the first, second, and third transparent electrode layers 112, 114, and 116. In other words, the end portion of the partition layer 118 is formed on outer sides than end portions of the reflective electrode layer 110 and the first, second, or third transparent electrode layer 112, 114, or 116. When the end portion of the partition layer 118 is formed on an outer side than the end portion of the reflective electrode layer 110, reflection of external light on the partition layer 118 can be reduced.

For details about the second substrate 152 and the light-blocking portion 161, the first coloring layer 162, the second coloring layer 164, and the third coloring layer 166 that are formed on the second substrate 152, Embodiment 1 can be referred to.

The display device illustrated in FIG. 9 is different from the display device illustrated in FIG. 1B in the shapes of the first transparent electrode layer 112, the second transparent electrode layer 114, and the third transparent electrode layer 116. Specifically, in the display device illustrated in FIG. 9, the end portions of the patterns of the first transparent electrode layer 112, the second transparent electrode layer 114, and the third transparent electrode layer 116 are tapered. When the end portions of the patterns of the first transparent electrode layer 112, the second transparent electrode layer 114, and the third transparent electrode layer 116 are tapered, a short-circuit at the end portions can be inhibited.

A method for fabricating the display device illustrated in FIG. 9 is described with reference to the description of the method for fabricating the display device in FIG. 1B.

First, as in the fabrication of the display device in FIG. 1B, the components up to those illustrated in FIG. 4D are formed.

Then, the conductive film 109 is etched to form the reflective electrode layer 110 in a predetermined region.

Then, a conductive film for forming the first transparent electrode layer 112 is formed. For example, as the conductive film, an amorphous ITO film can be formed to a thickness of 20 nm by a known sputtering method. Next, a commercially available photoresist is formed into a desired pattern by a known method. For the method for forming the desired pattern, the above embodiment can be referred to. Note that the end portion of the pattern of the first transparent electrode layer 112 is preferably formed on an outer side than the end portion of the pattern of the reflective electrode layer 110 by 4 μm.

Then, the above amorphous ITO film is etched. For example, the amorphous ITO film can be etched by immersing the substrate in an oxalic acid maintained at 35° C. in a thermostatic oven for 4 minutes. It is preferable that the substrate be washed with water after the etching. Then, the photoresist is removed; here, a method similar to that used in the above embodiment can be used.

The end portion of the pattern of the amorphous ITO film has a tapered shape because of the etching. That is, the end portion of the pattern of the first transparent electrode layer 112 is tapered. Next, baking is performed in an air oven at 220° C. for 1 hour, so that the amorphous ITO film becomes polycrystalline. Note that polycrystalline ITO has etching resistance against an oxalic acid.

Then, an amorphous ITO film is formed to a thickness of 40 nm. A commercially available photoresist is formed thereover into a desired pattern by a known method. The desired pattern is formed such that at least the G pixel region 174 and the R pixel region 176 are not covered. Here, the desired pattern is preferably formed on an outer side than the end portion of the pattern of the reflective electrode layer 110 by 4 μm.

Then, the above amorphous ITO film is etched. For example, the amorphous ITO film can be etched by immersing the substrate in an oxalic acid maintained at 35° C. in a thermostatic oven for 4 minutes. It is preferable that the substrate be washed with water after the etching. Then, the photoresist is removed; here, a method similar to that used in the above embodiment can be used.

Next, baking is performed in an air oven at 220° C. for 1 hour, so that the amorphous ITO film becomes polycrystalline.

Then, an amorphous ITO film is formed to a thickness of 40 nm. A commercially available photoresist is formed thereover into a desired pattern by a known method. The desired pattern is formed such that at least the R pixel region 176 is not covered. Here, the desired pattern is preferably formed on an outer side than the end portion of the pattern of the reflective electrode layer 110 by 4 μm.

Then, the above amorphous ITO film is etched. For example, the amorphous ITO film can be etched by immersing the substrate in an oxalic acid maintained at 35° C. in a thermostatic oven for 4 minutes. It is preferable that the substrate be washed with water after the etching. Then, the photoresist is removed; here, a method similar to that used in the above embodiment can be used.

Next, baking is performed in an air oven at 220° C. for 1 hour, so that the amorphous ITO film becomes polycrystalline.

Through the above steps, all the end portions of the patterns of the first transparent electrode layer 112, the second transparent electrode layer 114, and the third transparent electrode layer 116 have tapered shapes.

Then, the partition layer 118 is formed above the end portions of the patterns of the first transparent electrode layer 112, the second transparent electrode layer 114, and the third transparent electrode layer 116 and the conductive layer 108. For example, the partition layer 118 can be formed on an outer side than the end portion of the pattern of the first transparent electrode layer 112, the second transparent electrode layer 114, or the third transparent electrode layer 116 by 3 μm.

Next, as in the above embodiment, the EL layer 120 and the semi-transmissive electrode layer 122 are formed. The first substrate 102 and the second substrate 152 are then fitted to each other to perform sealing; thus, the display device illustrated in FIG. 9 can be fabricated.

The structure described in this embodiment can be used in appropriate combination with any of the structures described in the other embodiments.

[Embodiment 3]

A structure of a light-emitting element which is applicable to a display device of one embodiment of the present invention will be described with reference to FIGS. 10A to 10C.

The light-emitting element shown as an example in this embodiment includes a lower electrode, an upper electrode, and an organic layer between the lower electrode and the upper electrode. One of the lower and upper electrodes functions as an anode, and the other functions as a cathode. The organic layer is provided between the lower electrode and the upper electrode, and a structure of the organic layer may be appropriately determined in accordance with materials of the lower electrode and the upper electrode. Note that the organic layer described in this embodiment corresponds to the EL layer in the above embodiments.

<Configuration Example of Light-Emitting Element>

Figure 10A:
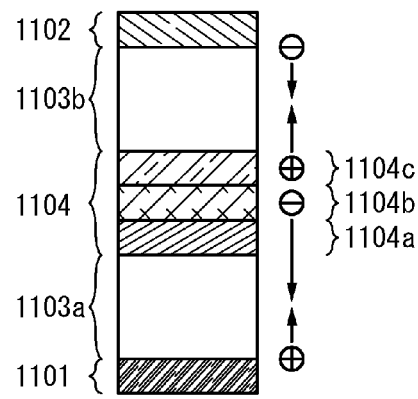
FIGS. 10A to 10C illustrate light-emitting elements applicable to a display device of one embodiment of the present invention.

An example of a configuration of the light-emitting element is illustrated in FIG. 10A. In the light-emitting element illustrated in FIG. 10A, an organic layer including a light-emitting unit 1103a and a light-emitting unit 1103b is provided between an anode 1101 and a cathode 1102. Furthermore, an intermediate layer 1104 is provided between the light-emitting unit 1103a and the light-emitting unit 1103b.

When a voltage higher than the threshold voltage of the light-emitting element is applied between the anode 1101 and the cathode 1102, holes are injected to the organic layer from the anode 1101 side and electrons are injected to the organic layer from the cathode 1102 side. The injected electrons and holes are recombined in the organic layer, so that a light-emitting substance contained in the organic layer emits light.

The number of light-emitting units provided between the anode 1101 and the cathode 1102 is not limited to two. A light-emitting element illustrated in FIG. 10C has what is called a tandem structure, that is, a structure in which a plurality of light-emitting units 1103 are stacked. Note that in the case where n (n is a natural number greater than or equal to 2) light-emitting units 1103 are provided between the anode and the cathode, for example, the intermediate layer 1104 is provided between an m-th light-emitting unit and an (m+1)-th light-emitting unit.

The light-emitting unit 1103 includes at least one light-emitting layer containing a light-emitting substance, and may have a structure in which the light-emitting layer and a layer other than the light-emitting layer are stacked. Examples of the layer other than the light-emitting layer are layers which contain a substance having a high hole-injection property, a substance having a high hole-transport property, a substance having a poor hole-transport property (substance which blocks holes), a substance having a high electron-transport property, a substance having a high electron-injection property, a substance having a bipolar property (substance having high electron- and hole-transport properties), and the like. In particular, the layer which contains a substance having a high hole-injection property and is provided in contact with the anode and the layer which contains a substance having a high electron-injection property and is provided in contact with the cathode serve to lower a barrier against carrier injection from the electrodes to the light-emitting unit. These layers can be each referred to as a carrier-injection layer.

Figure 10B:
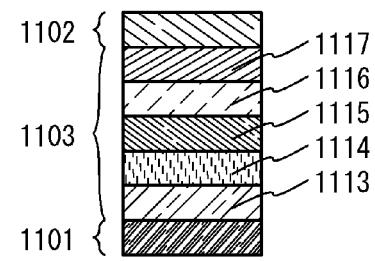
Figure 10C:
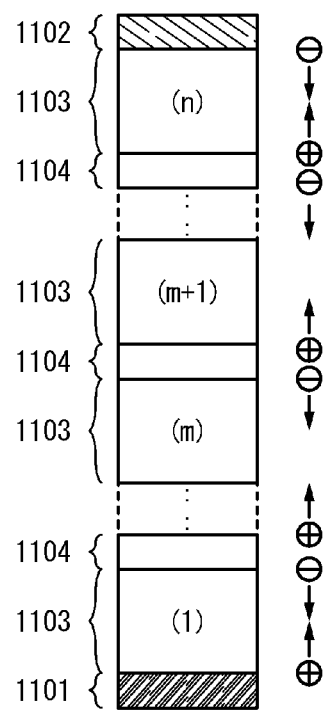
Figure 11:
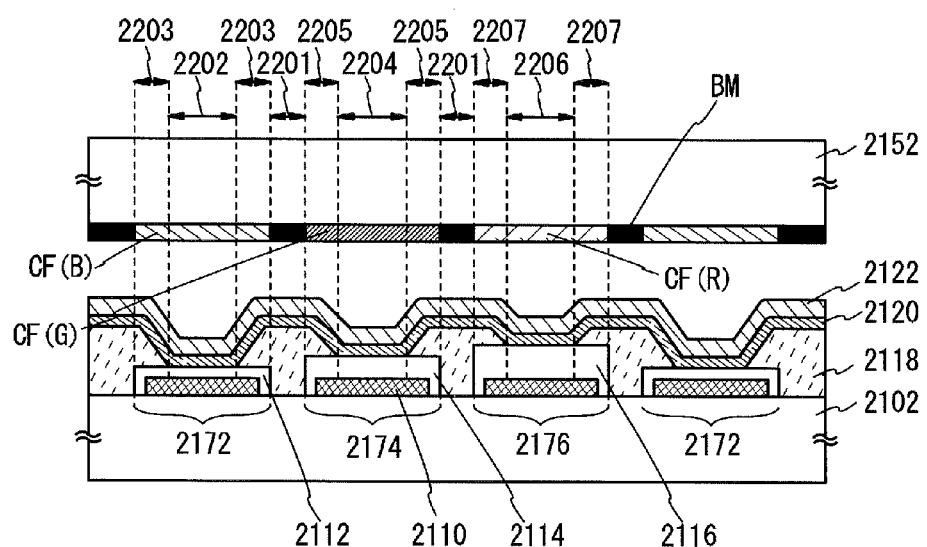
FIG. 11 illustrates a conventional display device.

An example of a specific configuration of the light-emitting unit 1103 is illustrated in FIG. 10B. In the light-emitting unit 1103 illustrated in FIG. 10B, a hole-injection layer 1113, a hole-transport layer 1114, a light-emitting layer 1115, an electron-transport layer 1116, and an electron-injection layer 1117 are stacked in that order from the anode 1101 side.

An example of a specific structure of the intermediate layer 1104 is illustrated in FIG. 10A. The intermediate layer 1104 may be formed to include at least a charge-generation region, and may have a structure in which the charge-generation region and a layer other than the charge-generation region are stacked. For example, a structure can be employed in which a first charge-generation region 1104c, an electron-relay layer 1104b, and an electron-injection buffer layer 1104a are stacked in that order from the cathode 1102 side.

The behaviors of electrons and holes in the intermediate layer 1104 are described. When a voltage higher than the threshold voltage of the light-emitting element is applied between the anode 1101 and the cathode 1102, in the first charge-generation region 1104c, holes and electrons are generated, and the holes move into the light-emitting unit 1103b provided on the cathode 1102 side and the electrons move into the electron-relay layer 1104b.

The electron-relay layer 1104b has a high electron-transport property and immediately transfers the electrons generated in the first charge-generation region 1104c to the electron-injection buffer layer 1104a. The electron-injection buffer layer 1104a can lower a barrier against electron injection into the light-emitting unit 1103a, so that the efficiency of the electron injection into the light-emitting unit 1103a is increased. Thus, the electrons generated in the first charge-generation region 1104c are injected into the lowest unoccupied molecular orbital (hereinafter referred to as "LUMO level") of the light-emitting unit 1103a through the electron-relay layer 1104b and the electron-injection buffer layer 1104a.

In addition, the electron-relay layer 1104b can prevent interaction in which the substance included in the first charge-generation region 1104c and the substance included in the electron-injection buffer layer 1104a react with each other at the interface therebetween and the functions of the first charge-generation region 1104c and the electron-injection buffer layer 1104a are impaired.

The holes injected into the light-emitting unit 1103b provided on the cathode side are recombined with electrons injected from the cathode 1102, so that a light-emitting substance contained in the light-emitting unit 1103b emits light. The electrons injected into the light-emitting unit 1103a provided on the anode side are recombined with holes injected from the anode side, so that a light-emitting substance contained in the light-emitting unit 1103a emits light. Thus, the holes and electrons generated in the intermediate layer 1104 cause light emission in different light-emitting units.

Note that the light-emitting units can be provided in contact with each other when these light-emitting units allow the same structure as the intermediate layer to be formed therebetween. Specifically, when one surface of the light-emitting unit is provided with a charge-generation region, the charge-generation region functions as a first charge-generation region of the intermediate layer; thus, the light-emitting units can be provided in contact with each other.

Note that an intermediate layer may be provided between the cathode and the n-th light-emitting unit.

<Material for Light-Emitting Element>

Next, specific materials that can be used for the light-emitting element having the above-described structure are described. Materials for the anode, the cathode, the organic layer, the charge-generation region, the electron-relay layer, and the electron-injection buffer layer are described in that order.

<Material for Anode>

The anode 1101 is preferably formed using a metal, an alloy, an electrically conductive compound, a mixture of these materials, or the like which has a high work function (specifically, a work function of higher than or equal to 4.0 eV is more preferable). Specifically, for example, indium tin oxide (ITO), indium tin oxide containing silicon or silicon oxide, indium zinc oxide (IZO), indium oxide containing tungsten oxide and zinc oxide, and the like are given.

Besides, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

It is also possible to combine a high-reflectance material and a high-transmittance material to form the anode as described in Embodiment 1.

Note that in the case where a second charge-generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge-generation region will be subsequently described together with a material for forming the first charge-generation region.

<Material for Cathode>

As a material of the cathode 1102, a material having a low work function (specifically, a work function lower than 4.0 eV) is preferably used; however, in the case where the first charge-generation region is provided between the cathode 1102 and the light-emitting unit 1103 to be in contact with the cathode 1102, various conductive materials can be used for the cathode 1102 regardless of their work functions.

Note that at least one of the cathode 1102 and the anode 1101 is formed using a conductive film that transmits visible light. As examples of a material for the conductive film that transmits visible light, indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Further, a metal thin film having a thickness small enough to transmit light (preferably, approximately 5 nm to 30 nm) can also be used.

<Material for Organic Layer>

Specific examples of materials for the layers included in the light-emitting unit 1103 will be given below.

<Hole-Injection Layer>

The hole-injection layer contains a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a polymer such as poly(3,4-ethylenedioxythiophene)/poly(styrenesulfonate) (PEDOT/PSS), or the like to form the hole-injection layer.

Note that the second charge-generation region may be used instead of the hole-injection layer. When the second charge-generation region is used, a variety of conductive materials can be used for the anode 1101 regardless of their work functions as described above. A material for forming the second charge-generation region will be subsequently described together with a material for forming the first charge-generation region.

<Hole-Transport Layer>

The hole-transport layer contains a substance having a high hole-transport property. The hole-transport layer is not limited to a single layer, and may be a stack including two or more layers each containing a substance having a high hole-transport property. The hole-transport layer contains any substance having a hole-transport property higher than an electron-transport property, and preferably contains a substance having a hole mobility of $10^{-6}$ cm$^2$/Vs or higher because the driving voltage of the light-emitting element can be reduced.

<Light-Emitting Layer>

The light-emitting layer contains a light-emitting substance. The light-emitting layer is not limited to a single layer, and may be a stack including two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

The light-emitting substance is preferably dispersed in a host material. A host material preferably has higher excitation energy than the light-emitting substance.

<Electron-Transport Layer>

The electron-transport layer contains a substance having a high electron-transport property. The electron-transport layer is not limited to a single layer, and may be a stack including two or more layers each containing a substance having a high electron-transport property. The electron-transport layer contains any substance having an electron-transport property higher than a hole-transport property, and preferably contains a substance having an electron mobility of $10^{-6}$ cm$^2$/Vs or higher because the driving voltage of the light-emitting element can be reduced.

<Electron-Injection Layer>

The electron-injection layer contains a substance having a high electron-injection property. The electron-injection layer is not limited to a single layer, and may be a stack including two or more layers each containing a substance having a high electron-injection property. The electron-injection layer is preferably provided because the efficiency of electron injection from the cathode 1102 can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a substance having an electron-transport property and an alkali metal, an alkaline earth metal, magnesium (Mg), or a compound thereof (e.g., Alq containing magnesium (Mg)) can be used.

<Material for Charge-Generation Region>

The first charge-generation region 1104c and the second charge-generation region are regions containing a substance having a high hole-transport property and an acceptor substance. Note that the charge-generation region is not limited to the structure in which one film contains the substance having a high hole-transport property and the acceptor substance, and may be a stacked layer of a layer containing the substance having a high hole-transport property and a layer containing the acceptor substance. In the case where the second charge-generation region which is in contact with the anode has a stacked-layer structure, the layer containing the acceptor substance is in contact with the anode 1101.

Note that the acceptor substance is preferably added to the charge-generation region so that the mass ratio of the acceptor substance to the substance having a high hole-transport property is from 0.1:1 to 4.0:1.

As the acceptor substance that is used for the charge-generation region, a transition metal oxide, particularly an oxide of a metal belonging to any of Groups 4 to 8 of the periodic table is preferable. Specifically, molybdenum oxide is particularly preferable. Note that molybdenum oxide has a low hygroscopic property.

As the substance with a high hole-transport property used for the charge-generation region, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of $10^{-6}$ cm$^2$/Vs or higher is preferably used. However, any substance other than the above-described materials may also be used as long as the substance has a hole-transport property higher than an electron-transport property.

<Material for Electron-Relay Layer>

The electron-relay layer 1104b can immediately receive electrons drawn out by the acceptor substance in the first charge-generation region 1104c. Therefore, the electron-relay layer 1104b contains a substance having a high electron-transport property, and the LUMO level thereof is positioned between the acceptor level of the acceptor substance in the first charge-generation region 1104c and the LUMO level of the light-emitting unit 1103. Specifically, the LUMO level of the electron-relay layer 1104b is preferably about from −5.0 eV to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or fluorine is preferably used because such a compound further facilitates acceptance of electrons in the electron-relay layer 1104b.

<Material for Electron-Injection Buffer Layer>

The electron-injection buffer layer 1104a facilitates electron injection from the first charge-generation region 1104c into the light-emitting unit 1103a. By providing the electron-injection buffer layer 1104a between the first charge-generation region 1104c and the light-emitting unit 1103a, the injection barrier therebetween can be lowered.

A substance having a high electron-injection property can be used for the electron-injection buffer layer 1104a. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

Further, in the case where the electron-injection buffer layer 1104a contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron-transport property, a material similar to the above material for the electron-transport layer which can be formed in part of the light-emitting unit 1103 can be used.

<Method for Fabricating Light-Emitting Element>

A method for fabricating the light-emitting element will be described. Over the lower electrode, the layers described above are combined as appropriate to form an organic layer. Any of a variety of methods (e.g., a dry process or a wet process) can be used to form the organic layer depending on the material for the organic layer. For example, a vacuum evaporation method, an inkjet method, a spin coating method, or the like may be selected. Note that a different formation method may be employed for each layer. The upper electrode is formed over the organic layer, so that the light-emitting element is fabricated.

The light-emitting element described in this embodiment can be fabricated by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. In order to obtain white light emission, for example, a configuration may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

Note that this embodiment can be implemented in an appropriate combination with any of the other embodiments described in this specification.

Furthermore, one embodiment of the present invention can be applied to electronic devices having the display device described above.

This application is based on Japanese Patent Application serial no. 2013-058650 filed with Japan Patent Office on Mar. 21, 2013, the entire contents of which are hereby incorporated by reference.

What is claimed is:

1. A display device comprising a pixel, the pixel comprising:
   a light-emitting element comprising:
      a reflective electrode layer;
      a transparent electrode layer over the reflective electrode layer;
      a layer containing a light-emitting organic compound, over the transparent electrode layer; and
      a semi-transmissive electrode layer over the layer containing the light-emitting organic compound,
   a partition layer surrounding the reflective electrode layer; and
   a coloring layer over the semi-transmissive electrode layer,
   wherein the coloring layer overlaps with the reflective electrode layer and the partition layer,
   wherein the partition layer does not overlap with the reflective electrode layer in both a row direction and a column direction of the pixel, and
   wherein an optical path length between the reflective electrode layer and the semi-transmissive electrode layer is adjusted by a thickness of the transparent electrode layer.

2. The display device according to claim 1, wherein an end portion of the transparent electrode layer has a tapered shape.

3. The display device according to claim 1, wherein an end portion of the transparent electrode layer is positioned on an outer side than an end portion of the reflective electrode layer.

4. The display device according to claim 1, wherein an end portion of the transparent electrode layer is substantially aligned with an end portion of the reflective electrode layer.

5. The display device according to claim 1, wherein an end portion of the partition layer is positioned on an outer side than an end portion of the reflective electrode layer.

6. An electronic device comprising the display device according to claim 1.

7. A display device comprising a pixel, the pixel comprising:
   a light-emitting element comprising:
      a reflective electrode layer;
      a transparent electrode layer over the reflective electrode layer;
      a layer containing a light-emitting organic compound, over the transparent electrode layer; and
      a semi-transmissive electrode layer over the layer containing the light-emitting organic compound,
   a partition layer surrounding the reflective electrode layer and the transparent electrode layer; and
   a coloring layer over the semi-transmissive electrode layer,
   wherein the coloring layer overlaps with the reflective electrode layer and the partition layer,
   wherein the partition layer does not overlap with the reflective electrode layer and the transparent electrode layer in both a row direction and a column direction of the pixel, and wherein an optical path length between the reflective electrode layer and the semi-transmissive electrode layer is adjusted by a thickness of the transparent electrode layer.

8. The display device according to claim 7, wherein an end portion of the transparent electrode layer has a tapered shape.

9. The display device according to claim 7, wherein an end portion of the transparent electrode layer is substantially aligned with an end portion of the reflective electrode layer.

10. The display device according to claim 7, wherein an end portion of the partition layer is positioned on an outer side than an end portion of the reflective electrode layer.

11. The display device according to claim 10, wherein an end portion of the transparent electrode layer which is positioned on an outer side than the end portion of the reflective electrode layer comprises a first region being in contact with the layer containing the light-emitting organic compound and a second region being in contact with the partition layer.

12. An electronic device comprising the display device according to claim 7.

13. A display device comprising a first pixel and a second pixel, the first pixel comprising:
a first light-emitting element comprising:
a first reflective electrode layer;
a first transparent electrode layer over the first reflective electrode layer;
a layer containing a light-emitting organic compound, over the first transparent electrode layer; and
a semi-transmissive electrode layer over the layer containing the light-emitting organic compound,
the second pixel comprising:
a second light-emitting element comprising:
a second reflective electrode layer;
a second transparent electrode layer over the second reflective electrode layer;
the layer containing the light-emitting organic compound, over the second transparent electrode layer; and
the semi-transmissive electrode layer over the layer containing the light-emitting organic compound,
a partition layer surrounding each of the first reflective electrode layer and the second reflective electrode layer; and
a first coloring layer and a second coloring layer over the semi-transmissive electrode layer,
wherein the first coloring layer overlaps with the first reflective electrode layer and the partition layer,
wherein the second coloring layer overlaps with the second reflective electrode layer and the partition layer,
wherein the partition layer does not overlap with the first reflective electrode layer in both a row direction and a column direction of the first pixel, and th epartition layer does not overlap with the second reflective electrode layer in both a row direction and a column direction of the second pixel, and
wherein optical path lengths between each of the first reflective electrode layer and the second reflective electrode layer and the semi-transmissive electrode layer are adjusted by thicknesses of the first transparent electrode layer and the second transparent electrode layer.

14. The display device according to claim 13, wherein each of an end portion of the first transparent electrode layer and an end portion of the second transparent electrode layer has a tapered shape.

15. The display device according to claim 13,
wherein an end portion of the first transparent electrode layer is positioned on an outer side than an end portion of the first reflective electrode layer, and
wherein an end portion of the second transparent electrode layer is positioned on an outer side than an end portion of the second reflective electrode layer.

16. The display device according to claim 13,
wherein an end portion of the first transparent electrode layer is substantially aligned with an end portion of the first reflective electrode layer, and
wherein an end portion of the second transparent electrode layer is substantially aligned with an end portion of the second reflective electrode layer.

17. The display device according to claim 13, wherein an end portion of the partition layer is positioned on an outer side than end portions of the first reflective electrode layer and the second reflective electrode layer.

18. The display device according to claim 13, wherein the thicknesses of the first transparent electrode layer and the second transparent electrode layer are different from each other.

19. An electronic device comprising the display device according to claim 13.

20. The display device according to claim 17, further comprising:
a first transistor and a first conductive layer electrically connected to the first transistor; and
a second transistor and a second conductive layer electrically connected to the second transistor,
wherein the first conductive layer is provided below the first reflective electrode layer,
wherein an end portion of the first conductive layer is substantially aligned with an end portion of the first transparent electrode layer,
wherein the second conductive layer is provided below the second reflective electrode layer, and
wherein an end portion of the second conductive layer is substantially aligned with an end portion of the second transparent electrode layer.

* * * * *